United States Patent [19]

Nishida et al.

[11] 3,789,503

[45] Feb. 5, 1974

[54] INSULATED GATE TYPE FIELD EFFECT DEVICE AND METHOD OF MAKING THE SAME

[75] Inventors: Sumio Nishida; Yasunobu Kosa, both of Tokyo, Japan

[73] Assignee: Hitachi, Ltd., Tokyo, Japan

[22] Filed: June 25, 1971

[21] Appl. No.: 156,709

[30] Foreign Application Priority Data

June 26, 1970 Japan .............................. 45/55148

[52] U.S. Cl. ...................................... 29/571, 29/578

[51] Int. Cl. ............................................ B01j 17/00

[58] Field of Search .............................. 29/591, 578

[56] References Cited

UNITED STATES PATENTS

| | | | |
|---|---|---|---|
| 3,701,198 | 10/1972 | Glinski | 29/578 |
| 3,450,959 | 6/1969 | Dale | 29/578 |
| 3,370,995 | 2/1968 | Lowery et al. | 29/580 |

*Primary Examiner*—Charles W. Lanham
*Assistant Examiner*—Wilbur C. Tupman
*Attorney, Agent, or Firm*—Craig & Antonelli

[57] ABSTRACT

An insulated gate type field effect transistor having a source, a drain and a clamping diode region of P conductivity type formed in an N conductivity type silicon substrate and a low resistivity region of $N^+$ conductivity type formed in the substrate surface except in the channel region so as to bridge the source region and the clamping diode region.

9 Claims, 12 Drawing Figures

Figure 1:
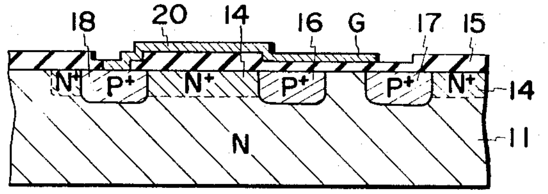
Figure 2A:
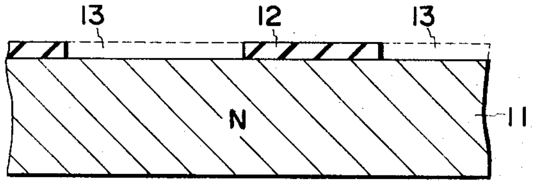
Figure 2B:
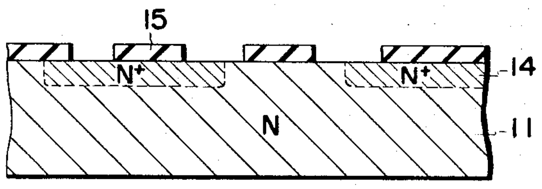
Figure 2C:
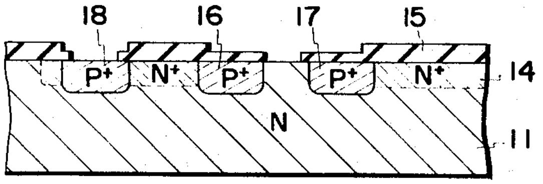
Figure 2D:
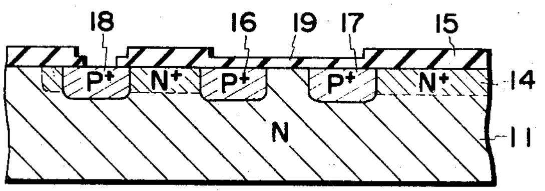
Figure 2E:
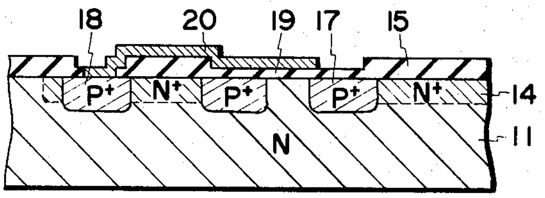
Figure 3A:
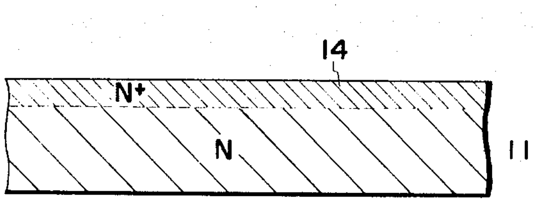
Figure 3B:
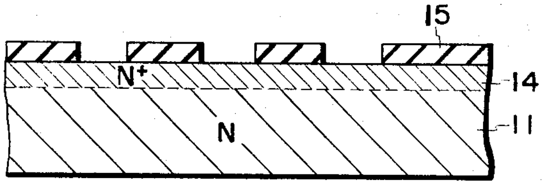
Figure 3C:
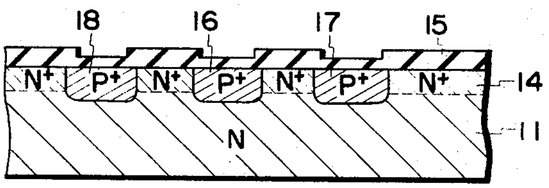
Figure 3D:
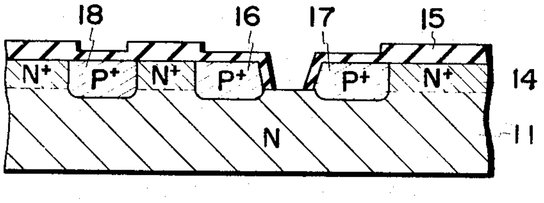
Figure 3E:
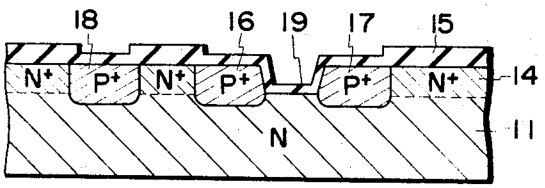
Figure 3F:
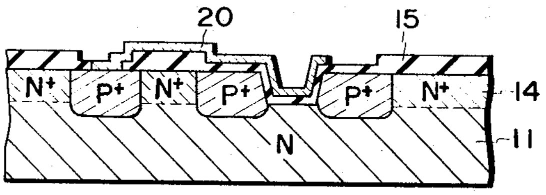

INVENTORS
SUMIO NISHIDA AND
YASUNOBU KOSA

BY

Craig, Antonelli & Hill
ATTORNEYS

Patented Feb. 5, 1974 3,789,503

2 Sheets-Sheet 2

INVENTORS
SUMIO NISHIDA
BY AND YASUNOBU KOSA

Craig, Antonelli & Hill
ATTORNEYS

INSULATED GATE TYPE FIELD EFFECT DEVICE AND METHOD OF MAKING THE SAME

The present invention relates to semiconductor devices, more particularly to MOS type semiconductor devices, and to the method for manufacturing the same.

Conventional insulated gate type field effect transistors such as MOS type transistors generally comprise a pair of diffused regions serving as a source and a drain formed in a major surface of an N-type silicon substrate, a silicon oxide film formed on the surface of the substrate, a gate electrode formed on the silicon oxide film by aluminum evaporation process, a clamp diode region of P-type formed in another portion of the substrate surface in order to protect the gate insulator from breakdown thereof due to a large input voltage, and an aluminum interconnection formed on the silicon oxide film so as to connect the clamp diode to the gate electrode.

However, the defect exists in the conventional semiconductor devices that when an electric voltage higher than a certain value is applied to the gate electrode, the conductivity type of the substrate surface under the aluminum interconnection is inverted to a P conductivity type, whereby an undesirable parasitic channel is generated.

To prevent the generation of the parasitic channel, two possible ways exist as follows: (1) The resistivity of the substrate may be made extremely low, but in this case the threshold voltage becomes too high, and (2) the oxide film may be considerably thickened, but in that case the defects then exist that the precision of photo-etching is reduced, and disconnections of the aluminum interconnection are apt to be caused due to the level difference in the thickness of the oxide film.

An object of this invention is to provide an MOS type semiconductor device wherein a parasitic channel induced by the existence of an inter-connection and insulating film can be completely prevented without raising the threshold voltage.

It is another object of this invention to provide an MOS type semiconductor device in which the generator of a parasitic channel can be prevented without thickening the oxide film, and in which therefore, no rupture or disconnection of any interconnections due to the level difference in the thickness of the oxide film is caused.

It is a further object of this invention to provide a novel method of manufacturing MOS ICs, according to which the number of the photo-etching steps can be reduced, and both the integration density and precision of the size can be increased resulting in low manufacturing cost.

This invention is characterized in that in a semiconductor device in which an active region having an insulated gate portion is formed in a major surface of a semiconductor substrate, a semiconductor layer having the same conductivity type as the substrate and a lower resistivity than that of the substrate is formed in the substrate surface not occupied by the gate portion to prevent the generation of a parasitic channel induced in the semiconductor substrate surface not occupied by the gate portion.

This invention comprises the steps of forming a thin semiconductor layer of low resistivity and of the same conductivity type as the substrate by diffusing an impurity into a major substrate surface excluding a gate portion of a high resistivity silicon semiconductor substrate having one conductivity type, selectively forming an insulating film such as a silicon oxide film on the substrate, forming active regions such as a source, a drain and a semiconductor region for protecting the gate insulator through holes formed in the oxide film by diffusing an impurity of a conductivity type different from that of the substrate, forming a thin gate insulator by making a portion of the oxide film thin, selectively removing portions of the oxide film, and forming interconnections in ohmic contact with the respective semiconductor regions.

This invention further comprises the steps of forming a low resistivity layer on the entire major surface of a silicon semiconductor substrate having one conductivity type and a high resistivity, by diffusing an impurity of the same conductivity type as the substrate, or by epitaxial growth including the impurity, selectively forming an oxide film on the surface of the lower resistivity layer, forming a source, a drain and a semiconductor region for protecting the gate in the portions over which the oxide film is not formed by diffusing an impurity of a conductivity type different from that of the substrate, etching a portion of the oxide film and of the low resistivity layer to expose the substrate, forming a new oxide film on the exposed portion to form a thin gate insulator, and partially removing the oxide film excluding the gate insulating film, and forming interconnections in ohmic contact with the respective semiconductor regions.

According to the methods of this invention the photo-etching process becomes more simple and the oxide film need not be thickened, so that the precision of the manufacture is improved and the problem of disconnections is eliminated.

FIG. 1 is a cross-sectional view of a principal part of an MOS type semiconductor device, showing a principal structure in accordance with this invention;

FIGS. 2(*a*) to 2(*e*) show the sectional views of the device in the various manufacturing steps of an MOS type semiconductor device in accordance with this invention, and FIGS. 3(*a*) to 3(*f*) also show sectional views of the device in the various manufacturing steps of another embodiment of this invention.

A detailed explanation of the preferred embodiments of the invention will be made.

Embodiment 1

As shown in FIG. 2(*a*), an N-type monocrystalline silicon wafer 11 of about 1 to about 20 Ω cm resistivity is prepared, and is heated for about 2 hours in an oxidizing atmosphere at about 1,000°C, thereby forming an oxidized surface film 12 to a thickness of about 0.6$\mu$. Thereafter portions 13 of the oxide film except for the oxide film where the gate region is to be formed are selectively removed by conventional photoetching techniques.

As shown in FIG. 2(*b*), $N^+$-type diffused regions 14 are shallowly formed under the portion which is not covered with the oxide film 12, by diffusing, for example, phosphrous with a low concentration (the surface concentration being of the order of $C_s$=$10^{16}$ to 5 × $10^{17}$), using the oxide films 12 as a mask. Simultaneously with the diffusion process or after the diffusion process, a new thick oxide film 15 is formed on the entire surface, and then, portions of the oxide film 15 are selectively removed for the following P-type diffusion by conventional photo-etching techniques.

As shown in FIG. 2(*c*), a source region 16, a drain region 17 and a gate protecting diode region 18 are formed, for example, by boron diffusion using the oxide films 15 as a mask. Thereafter, the oxide film disposed on the portion for a gate is etched away to expose the substrate surface.

The gate portion is thereupon reoxidized, thereby forming a new silicon oxide film 19, as shown in FIG. 2(*d*), to a thickness of about 0.16$\mu$, whereupon the oxide film on the protecting diode region 18, the source region 16 and the drain region 17 are selectively removed by photo-etching. Interconnections 20, of which only one is shown, contacting each region are formed by evaporating aluminum on the entire surface, and then removing unwanted portions by photo-etching. The gate electrode on the oxide film 19 is electrically connected to the protecting diode portion 18 by one of these interconnections.

In an MOS type transistor formed in accordance with the embodiment, as shown in FIG. 1, the generation of parasitic channels is prevented by the existence of the $N^+$-type diffused layer 14 in the substrate surface except in the gate portion G, and the break-down voltage of the gate protecting diode 18 (of a so-called clamping diode) can be controlled within predetermined values, expecially at a certain low value. In the above-described structure, even if the oxide film 15 on the substrate is relatively thin, the substrate surface between the source and diode regions has a relatively high impurity concentration, so that the value of the gate voltage which would induce a parasitic channel, namely, the threshold voltage, can be raised. For example, in case, the oxide film 15 has a thickness of about 7,000 A, the threshold voltage is no less than about 25 V. Also, since the oxide film is not excessively thick, i.e., not more than 1$\mu$, any large level difference hardly occurs, expecially in the case of forming holes for the source and drain diffusion by photo-etching, no conspicuous level difference of the oxide film is caused, so that the precision in the manufacture can be elevated and the disconnection of the aluminum interconnections can be prevented. The break-down voltage of the protecting diode 18, that is, of the clamping diode, is determined by the junction between the $N^+$-type diffused layer 14 and the $P^+$-type diffused layer, namely, it is controlled to a predetermined value by changing the concentration of the $N^+$-type diffused layer 14. Furthermore, according to the described embodiment, the number of the manufacturing steps is decreased because the number of the steps for aligning the mask for photo-etching is reduced, and not as wide a space is necessary for the mask alignment as before, so that the integration density of the IC is elevated.

Embodiment 2

FIGS. 3(*a*) to 3(*f*) show a further modified embodiment of this invention.

As shown in FIG. 3(*a*), an $N^+$-type layer 14 is formed on a major surface of an N-type silicon monocrystalline substrate 11 by diffusion or epitaxial growth.

Then, as shown in FIG. 3(*b*), a sillicon oxide film 15 is formed by heating the substrate in an oxidizing atmosphere, or by depositing from vapor phase of silicon compounds in a low temperature, whereupon portions of the oxide film 15 are selectively removed by photo-etching.

As shown in FIG. 3(*c*), a source region 16, a drain region 17 and a clamping diode region 18 are formed by diffusion of a P-type impurity such as boron.

As shown in FIG. 3(*d*), the oxide film and the $N^+$-type layer 14 of the gate portion are removed by photo-etching to expose the silicon substrate.

Then, as shown in FIG. 3(*e*), the exposed surface 11 of the silicon substrate is reoxidized, thereby forming a thin gate oxide film 19 having a predetermined thickness thereon of about 1,000 to 1,600 A. Thereafter predetermined portions of the oxide film on the $P^+$-type regions are removed by photo-etching techniques.

Finally, aluminum interconnection layers 20 in ohmic contact with respective regions, are formed by evaporating aluminum on the entire surface and then by removing unwanted portions of the aluminum by photo-etching, as shown in FIG. 3(*f*).

The semiconductor device of the second embodiment has the same advantages as the one according to the first embodiment, and the manufacturing process itself has the same advantages.

Although the description and explanation is made hereinabove with respect to a single MOS type semiconductor device, the inventive principles are also applicable to integrated circuit devices of any known type.

Consequently, while we have shown and described several embodiments in accordance with the present invention, it is understood that this invention is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. A method of forming a semiconductor device comprising the steps of selectively forming a first insulating film on a surface of a semiconductor substrate, forming a thin semiconductor layer of low resistivity and of the same conductivity type as that of said substrate in the substrate over which said first insulating film was not formed, removing said first insulating film, forming a second insulating film on the whole surface of said substrate, selectively removing said second insulating film so as to make a first, a second and a third hole, said first and second holes exposing the substrate surface which was covered with said first insulating film, said third hole exposing the substrate surface wherein said semiconductor layer was formed, diffusing an impurity into the exposed substrate surface to form a first, a second and a third semiconductor region having an opposite conductivity type to that of said substrate through said first, second and third holes, respectively, removing selectively the portion of said second insulating film remaining on the substrate surface between said first and second regions, forming a third thin insulating film on the exposed portion of said substrate surface, and forming an interconnection layer ohmically contacting said third region and extending on said second and third insulating films.

2. A method of forming a semiconductor device comprising the steps of preparing a monocrystalline semiconductor substrate having one conductivity type; forming a thin semiconductor layer of low resistivity and of the same conductivity type as that of said substrate on the entire surface of said substrate; selectively forming an insulating film on the surface of said substrate; forming a source, a drain and a clamping diode region having an opposite conductivity type to that of said substrate in said substrate; etching all of said thin semiconductor layer between said source and drain regions; forming an interconnection layer ohmically contacting said clamping diode and extending over said insulating film; and forming a gate electrode over an insulating film portion between said source and drain regions, which is electrically connected with said interconnection layer.

3. A method according to claim 2, wherein said semiconductor layer is formed by epitaxial growth.

4. A method of forming a semiconductor device comprising the steps of forming a thin semiconductor layer of low resistivity contiguous to a substrate of higher resistivity, said semiconductor layer and said substrate being of the same conductivity type, selectively forming several semiconductor regions of a conductivity type opposite to said first-mentioned conductivity type, in at least portions of said semiconductor layer to form PN junctions by using an insulating film as a mask, forming an interconnecting layer in ohmic contact with one of said regions and extending over an insulating film portion formed over said semiconductor layer, and forming a gate electrode over an insulating film portion between two further ones of said regions, which is electrically connected with said interconnecting layer.

5. A method of forming an insulated gate type field effect device comprising the steps of:

forming a first, a second, a third, a fourth and a fifth region in a surface of a semiconductor substrate of one conductivity type, so that said first and second regions are of said one conductivity type and have a resistivity lower than that of the substrate, so that said third, fourth and fifth regions are of another conductivity type opposite to said one conductivity type, so that said third and fourth regions contact said first region and said fifth region contacts said second region, and so that a surface portion of the substrate is exposed between said fourth and fifth regions;

forming an insulating film covering said regions and the surfaces of the substrate, and having a hole extending to said third region; and forming on said insulating film a conductive layer covering said surface portion of the substrate so as to bridge said fourth and fifth regions, and being connected to said third region through said hole.

6. A method of forming an insulated gate type field effect device comprising the steps of:

selectively forming a first insulating film on a surface of a semiconductor substrate;

forming first semiconductor regions of low resistivity and of the same conductivity type as that of said substrate in portions of the substrate over which said first insulating film is not formed;

forming on the surfaces of said substrate and said first semiconductor regions a second insulating film having a first, a second and a third hole, said first and second holes exposing the substrate surfaces in which said first semiconductor regions were not formed and the surfaces of the adjoining first semiconductor regions, said third hole exposing the substrate surface wherein one of said first semiconductor regions is formed;

introducing an impurity into the exposed surfaces to form a second, a third and a fourth semiconductor region having an opposite conductivity type with respect to that of said substrate through said first, second and third holes, respectively;

selectively removing the portion of said second insulating film remaining on the substrate surface between said second and third regions, in which surface said first semiconductor region is not formed;

forming a third thin insulating film on the exposed portion of said substrate surface; and forming an interconnection layer ohmically contacting said third region and extending on said second and third insulating films.

7. A method of forming an insulated gate type field effect device comprising the steps of:

providing a semiconductor substrate of a first conductivity type;

forming in a first and second selected surface portions of said substrate, first and second semiconductor regions of said first conductivity type but of a resistivity lower than that of said substrate;

forming, in third, fourth and fifth selected surface portions of said substrate, third, fourth and fifth semiconductor regions of a second conductivity type opposite said first conductivity type, said third and fourth surface portions contacting said first surface portion so that said third and fourth regions contact said first region, and said fifth surface portion contacting said second surface portion but being spaced apart from said fourth surface portion by an exposed sixth surface portion of said substrate so that said fifth region contacts said second region;

selectively forming an insulating film on the surfaces of said regions except for a selected area of said third region; and forming a conductive layer on said selected area of said third region and over a selected portion of said insulating film, which selected portion of said film extends from said third region over said first and fourth regions to said sixth region.

8. A method according to claim 7, wherein the surface of said sixth region is substantially parallel with the surfaces of said fourth and fifth regions.

9. A method according to claim 8, wherein the surface of said sixth region is recessed in said substrate with respect to the surfaces of said fourth and fifth regions, so that said insulating film and said conductive layer extend into said recess.

* * * * *